(12) United States Patent
Drowley et al.

(10) Patent No.: US 11,315,884 B2
(45) Date of Patent: Apr. 26, 2022

(54) METHOD AND SYSTEM FOR FABRICATING FIDUCIALS USING SELECTIVE AREA GROWTH

(71) Applicant: NexGen Power Systems, Inc., Santa Clara, CA (US)

(72) Inventors: Clifford Drowley, Santa Clara, CA (US); Ray Milano, Santa Clara, CA (US); Robert Routh, Santa Clara, CA (US); Subhash Srinivas Pidaparthi, Santa Clara, CA (US); Andrew P. Edwards, Santa Clara, CA (US)

(73) Assignee: NEXGEN POWER SYSTEMS, INC., Santa Clara, CA (US)

( * ) Notice: Subject to any disclaimer, the term of this patent is extended or adjusted under 35 U.S.C. 154(b) by 1 day.

(21) Appl. No.: 16/929,896

(22) Filed: Jul. 15, 2020

(65) Prior Publication Data
US 2021/0020580 A1    Jan. 21, 2021

Related U.S. Application Data

(60) Provisional application No. 62/875,443, filed on Jul. 17, 2019.

(51) Int. Cl.
| | |
|---|---|
| *H01L 23/544* | (2006.01) |
| *H01L 21/02* | (2006.01) |
| *H01L 29/66* | (2006.01) |
| *H01L 27/088* | (2006.01) |
| *H01L 29/78* | (2006.01) |
| *H01L 21/8234* | (2006.01) |

(52) U.S. Cl.
CPC ...... *H01L 23/544* (2013.01); *H01L 21/02389* (2013.01); *H01L 21/823431* (2013.01); *H01L 27/0886* (2013.01); *H01L 29/66795* (2013.01); *H01L 29/785* (2013.01); *H01L 2223/54426* (2013.01)

(58) Field of Classification Search
CPC ............ H01L 23/544; H01L 21/02389; H01L 29/785; H01L 29/66795; H01L 27/0886; H01L 33/007
See application file for complete search history.

(56) References Cited

U.S. PATENT DOCUMENTS

2021/0202789 A1*  7/2021  Tezcan .................... H01L 33/12

* cited by examiner

*Primary Examiner* — Changhyun Yi
(74) *Attorney, Agent, or Firm* — Kilpatrick Townsend & Stockton LLP

(57) ABSTRACT

A method of forming alignment marks includes providing a III-V compound substrate having a device region and an alignment mark region, forming a hardmask layer having a first set of openings on the alignment mark region exposing a first surface portion of the III-V compound substrate and a second set of openings on the device region exposing a second surface portion of the III-V compound substrate, etching the exposed surface of the III-V compound substrate using the hardmask layer as a mask to form a plurality of trenches, and epitaxially regrowing a semiconductor layer in the trenches to form the alignment marks extending to a predetermined height over the processing surface of the III-V compound substrate.

20 Claims, 15 Drawing Sheets

METHOD AND SYSTEM FOR FABRICATING FIDUCIALS USING SELECTIVE AREA GROWTH

CROSS-REFERENCES TO RELATED APPLICATIONS

This application claims the benefit of priority to U.S. Provisional Patent Application No. 62/875,443, filed on Jul. 17, 2019, entitled "Method and System for Fabricating Fiducials Using Selective Area Growth," the disclosure of which is hereby incorporated by reference in its entirety for all purposes.

BACKGROUND OF THE INVENTION

A sequence of photolithography steps are generally required in the manufacture of semiconductor devices. Accordingly, in order to provide for alignment between a previously processed layer and a current layer, one or more fiducials (also referred to as alignment marks) can be formed as topographical steps or recesses in the processed layer. A protective layer (e.g., silicon oxide) may be formed over the topographical features in order to prevent damage to the fiducials (alignment marks) in a subsequent process. However, the protective layer can limit the resolution of the fiducials and increase the cost and processing time.

For example, some semiconductor fabrication processes require fiducials (alignment marks) that require at least one and sometimes two or more additional masking steps. The additional fiducials (alignment masks) and associated processing add tooling costs, cycle time, and potential defects to the process flow. Thus, there is a need in the art for improved methods and systems related to fiducials.

SUMMARY OF THE INVENTION

The present invention relates to semiconductor manufacturing technology, and more particularly, to a method of forming alignment marks and semiconductor devices having such alignment marks. In particular, in some semiconductor manufacturing processes, the surface of the semiconductor can be made substantially planar at certain steps in the process. One such process is selective area regrowth to form semiconductor layers embedded within an existing pattern. An example of such a regrowth which provides a substantially planar surface is given in U.S. Pat. No. 9,117,839 (Kizilyalli, et al.). In such a selective area regrowth process, it is desirable to be able to simultaneously form alignment structures having topographic relief relative to the planar regrowth surface.

In one aspect of the present disclosure, a method of forming alignment marks includes providing a III-V compound substrate having a device region and an alignment mark region, forming a hardmask layer having a first set of openings on the alignment mark region exposing a first surface portion of the III-V compound substrate and a second set of openings on the device region exposing a second surface portion of the III-V compound substrate, etching the exposed surface of the III-V compound substrate using the hardmask layer as a mask to form a plurality of trenches, and epitaxially regrowing a semiconductor layer in the trenches to form the alignment marks extending to a predetermined height over the processing surface of the III-V compound substrate.

In another aspect of the present disclosure, a semiconductor device may include a III-V compound substrate comprising a device region and an alignment mark region, and a plurality of three-dimensional and three-directional alignment marks in the alignment mark region. Each of the alignment marks may include a protrusion portion extending over a surface of the III-V compound substrate. In one embodiment, the III-V compound substrate includes an N—GaN epitaxial layer, and the alignment marks includes a p-GaN epitaxial layer.

Numerous benefits are achieved by way of the present invention over conventional techniques. For example, embodiments of the present invention utilize the enhanced growth rate of metal-organic chemical vapor deposition (MOCVD) epitaxial films adjacent to large areas of hardmask to create elevated features during a p-GaN regrowth process, even when the regrowth in the device array itself is planarized to the level of the fin top surface. Embodiments of the present invention can create alignment structures using a first selective area growth definition mask, which will be then be visible to a deep UV (DUV) aligner at a next alignment step after a p-GaN regrowth. In one embodiment, the selective area regrowth definition mask is the source definition mask that is also the first mask in the process flow according to embodiments of the present invention. According to some embodiments, other types of alignment marks (e.g., i-line alignment marks) can be subsequently created at a subsequent metal mask patterning step for subsequent mix-and-match alignment.

Moreover, embodiments of the present invention provide methods and systems that concurrently generate alignment features (marks) during epitaxial regrowth of gate regions for a vertical fin-based FET device, potentially avoiding the use additional mask layers. The novel approach utilizes the enhanced growth rate of MOCVD epitaxial films adjacent to large areas of a hardmask to create elevated features during the p-GaN regrowth step, even when the regrowth in the device array is planarized to the level of the fin top surface. In some embodiments, the regrowth of the alignment features is self-limiting so that the height of the alignment features (marks) can be predetermined by an opening width of a patterned mask layer. These and other embodiments of the invention along with many of its advantages and features are described in more detail in conjunction with the text below and attached figures.

DETAILED DESCRIPTION OF SPECIFIC EMBODIMENTS

Some semiconductor devices include one or more layers of epitaxially grown semiconductor materials. Selective area metal-organic vapor phase epitaxy (SA-MOVPE) is one of the fabrication methods for vertical fin field effect transistor (FinFET) devices.

Figure 1:
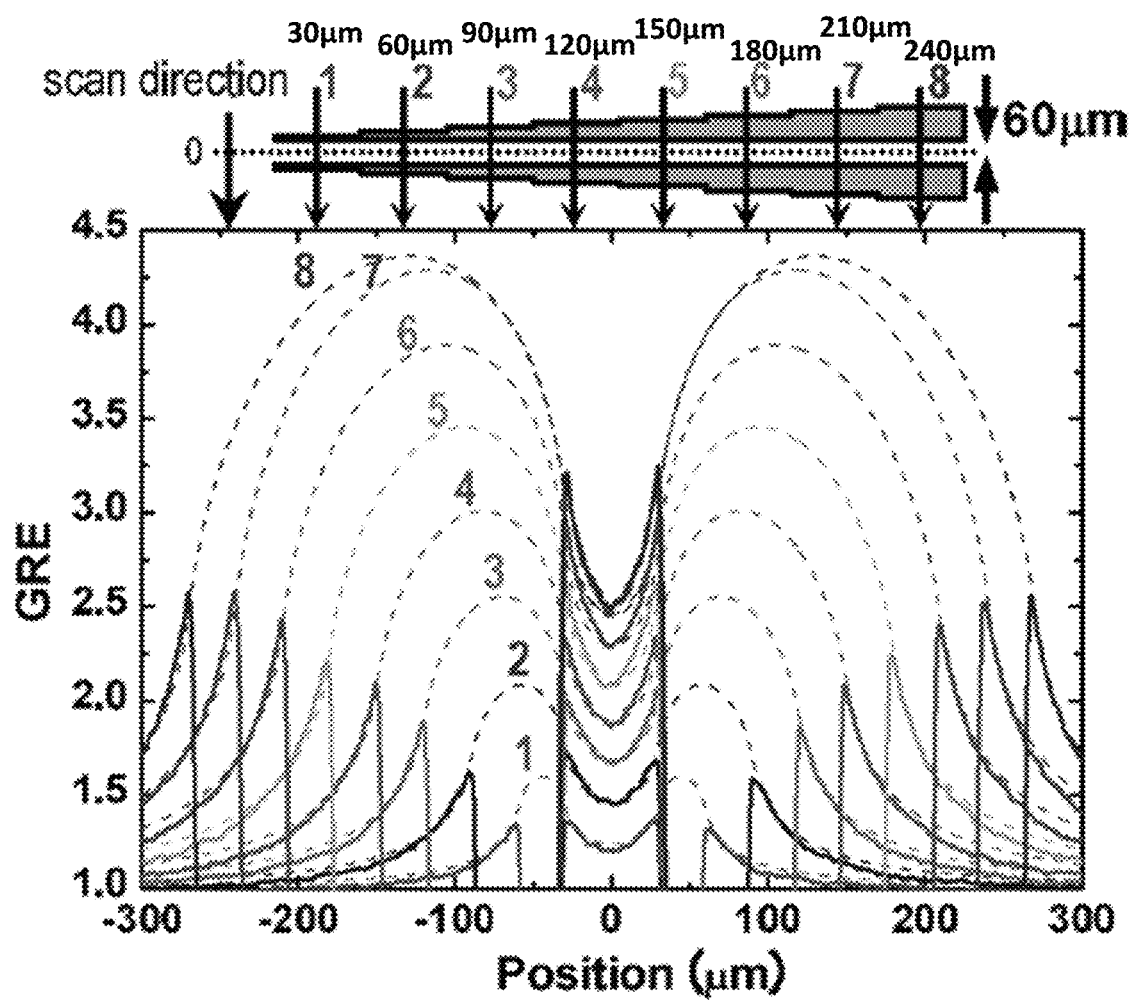
FIG. 1 is a graph illustrating measured and simulated growth-rate-enhancement (GRE) profiles of GaN adjacent to different hardmask widths according to embodiments of the present disclosure.

FIG. 1 is a graph illustrating measured and simulated growth rate enhancement (GRE) profiles of GaN adjacent to different mask widths that may be utilized in embodiments of the present disclosure. FIG. 1 is described in the publication "Selective Area Metal-Organic Vapor Phase Epitaxy of Nitride Semiconductors for Multicolor Emission" by Tomonari Shioda et al. IEEE Journal of Selected Topics in Quantum Electronics, 2009. The width of mask pairs are increased step by step. This paper is hereby incorporated by reference in its entirety. The measured value of GRE is derived by normalizing a thickness at a given position by the thickness at the planar position. Referring to FIG. 1, the mask opening is 60 μm and the mask widths of the mask pairs vary from 30 μm at position 1 (position is shown in μm on the x-axis) to 240 μm at position 8 with an incremental amount of 30 μm at each subsequent position. The growth temperature was 1150° C. and the pressure was 100 mbar with $H_2$ carrier gas. The solid lines denote experimental (i.e., measured) GRE values along the different mask widths of mask pairs (indicated by arrows 1 to 8) in the schematic of the mask pattern, and the dashed lines denote calculated (i.e., simulated) GRE profiles with $D/k_s$=50 μm, where D is the mass diffusivity ($m^2/s$) in the vapor phase and $k_s$ is the surface reaction rate constant (m/s). Selective-area MOCVD growth of GaN is affected by the selective-growth hardmask. Gallium that reaches the hardmask surface prefers to diffuse to the nearby GaN surface, where it is incorporated into the growing film. As a result, the growth rate of GaN next to large-area hardmask regions is enhanced by the flux of Ga species from the hardmask surface.

Figure 2A:
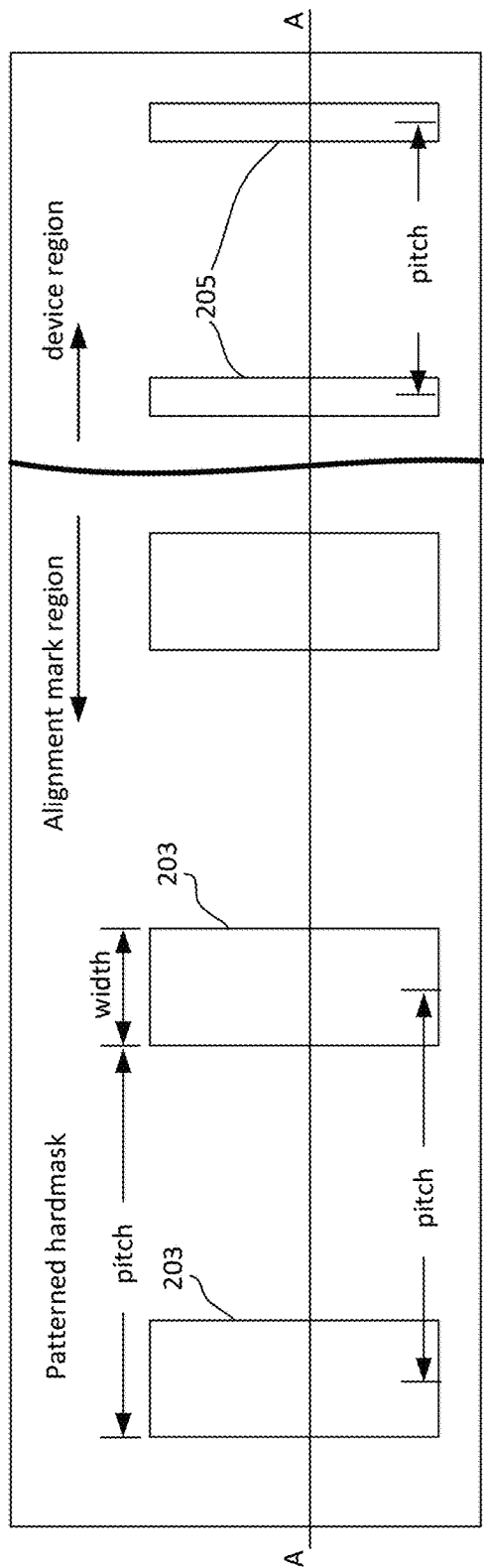
FIG. 2A is a top plan view of a partially patterned hardmask layer including an alignment mask layout and a fin layout according to an embodiment of the present disclosure.

A method of manufacturing a semiconductor device is described with reference to FIGS. 2A, 2B, 2C, and 2D. FIG. 2A is a top plan view of a partially patterned hardmask layer including an alignment mask layout and a semiconductor active device area fin layout according to an embodiment of the present disclosure. The method of manufacturing a semiconductor device may include providing a semiconductor substrate, e.g., a III-nitride compound substrate. In an embodiment, the III-nitride compound substrate is an n-type GaN substrate on which is grown an n-type GaN epitaxial layer, a second n-type GaN epitaxial layer with a graded dopant concentration, and a third n-type GaN epitaxial layer with a higher dopant concentration than the first epitaxial layer. The method also includes forming a patterned hardmask layer on the semiconductor substrate. As used herein, the terms "fiducials" and "alignment marks" are interchangeably used. The terms "alignment fiducial" and "alignment mark" are interchangeably used. The patterned hardmask layer has an alignment mark region including a plurality of alignment mark openings 203 and a device region including a plurality of fins protected by the hardmask separated by openings 205, as shown in FIG. 2A. In some embodiments, the plurality of alignment mark openings 203 each have a width of about 0.7 μm, and the pitch measured from center-to-center of two adjacent alignment mark openings is about 3 μm. In some embodiments, the plurality of alignment mark openings 203 each have a width between 0.6 and 2.0 μm, and the pitch measured from center-to-center of two adjacent alignment mark openings is about 8 μm. In some embodiments, the plurality of fin openings 205 each have a width of about 1.8 μm, the fins each have a width of about 0.2 μm, and the pitch measured from center-to-center of two adjacent fin openings is about 2.0 μm. Other embodiments can utilize other values for the width and center-to-center spacing of the alignment mark openings as well as the width and center-to-center spacing of the fin openings and these values are merely exemplary. One of ordinary skill in the art would recognize many variations, modifications, and alternatives.

Figure 2B:
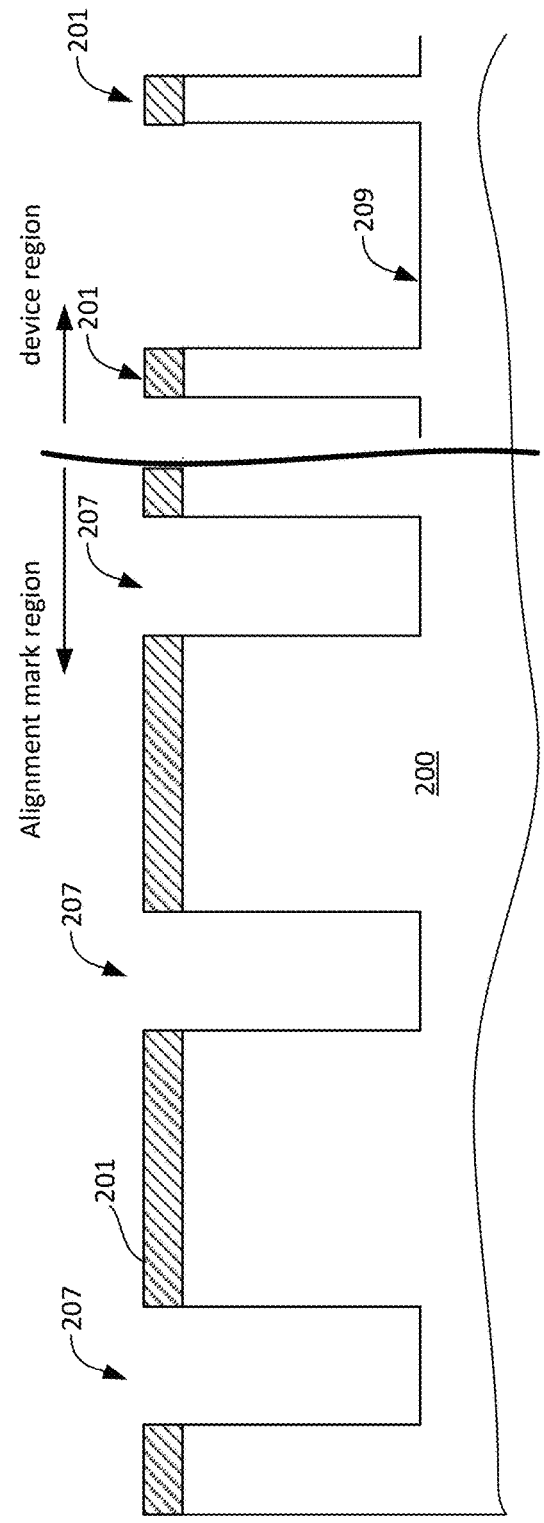
FIG. 2B is a partial cross-sectional view of the patterned hardmask layer taken along line A-A of FIG. 2A.

Referring to FIG. 2B, a hardmask layer 201 is formed on a semiconductor substrate 200. The hardmask layer can include one or more dielectrics such as oxides and nitrides or other suitable materials (including, e.g., refractory metals, metal alloys or metal compounds) that can be deposited, patterned, withstand etching processes, and withstand high temperature regrowth processes. The hardmask has a main lateral surface coinciding with the (0001) plane of the semiconductor substrate. In some embodiment, the semiconductor substrate may be misoriented from the <0001> direction by an angle. The method also includes removing a first portion in the alignment mark region and a second portion in the device region of the semiconductor substrate, using the patterned hardmask layer as a mask, by etching to form a first set of alignment mask trenches 207 in the alignment mask region and a second set of fin trenches 209 in the device region. In one embodiment, the trenches each may have a depth of 0.8 μm. In order to have uniform depth of the trenches, good controllability of the etch process is required. In some embodiments, an etch process may include chlorine-based chemistry using RIE to form the trenches, and a cleaning process may be carried out using a TMAH solution after etching the semiconductor substrate. The trenches includes sidewalls that are substantially perpendicular to the main surface of the semiconductor substrate. In some embodiments, the trench sidewalls in the device region are substantially parallel to the GaN m-plane.

Figure 2C:
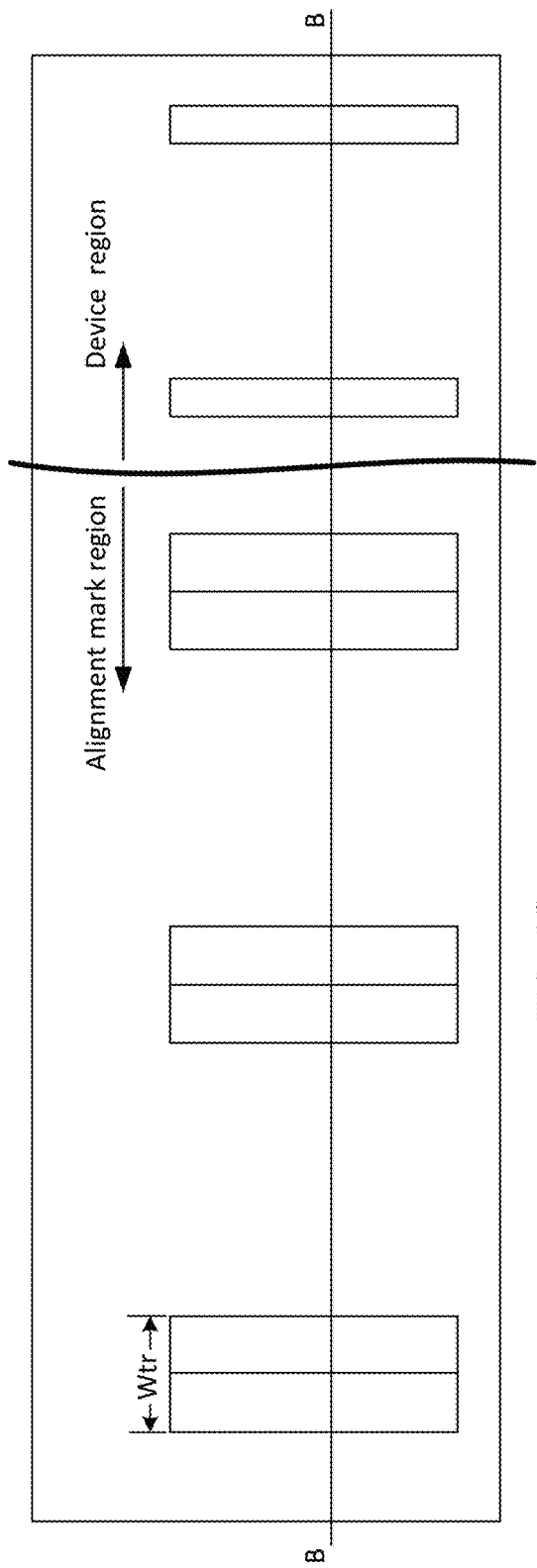
FIG. 2C is a top plan view of a p-GaN regrowth in trenches according to an embodiment of the present disclosure.

The method also includes epitaxially regrowing a semiconductor layer in the trenches until the semiconductor layer is substantially coplanar with the base of the hardmask in the device region. At the same time, a protrusion portion of the semiconductor layer extending over an upper surface of the semiconductor substrate reaches a predetermined height. FIG. 2C is a top plan view of a p-GaN regrowth in the trenches according to an embodiment of the present disclosure. In one embodiment, the p-GaN regrowth may be a metalorganic vapor phase epitaxy (MOVPE) that allows good in-plane control of thickness, strain, and bandgap energy.

Figure 2D:
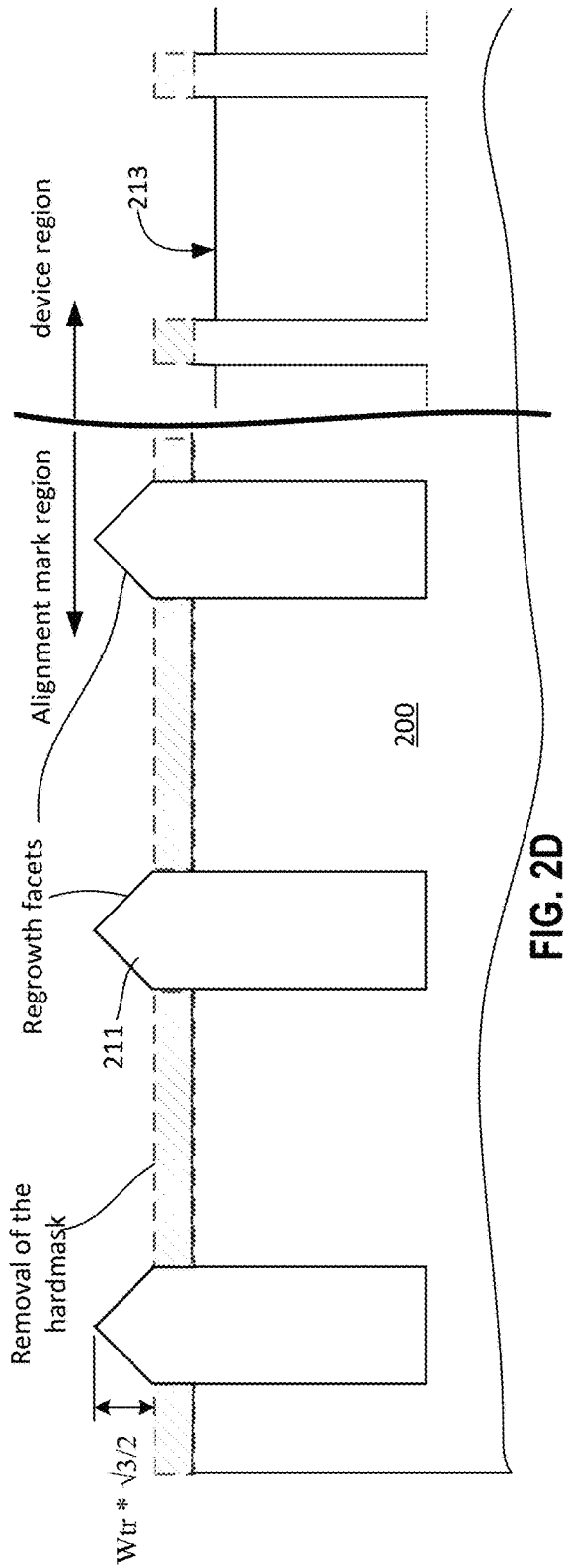
FIG. 2D is a cross-sectional view of p-GaN regrowth in trenches taken along line B-B of FIG. 2C and hardmask removal according to an embodiment of the present disclosure.

FIG. 2D is a cross-sectional view of the p-GaN regrowth in the trenches taken along the line B-B of FIG. 2C and the removal of the hardmask layer after an epitaxially regrowth of a semiconductor layer (e.g., p-GaN) according to an embodiment of the present disclosure. Referring to FIG. 2D, the epitaxial regrowth of a semiconductor layer in the alignment mark trenches has a portion 211 protruding over the hardmask while the regrowth of the semiconductor layer in the fin openings has an upper surface 213 below the hardmask, and the upper surface 213 of the semiconductor layer is substantially planar. The dotted line denotes the bottom of the trenches 209, which is now covered by the regrowth of the semiconductor layer. As discussed in relation to FIG. 1, because the width of the alignment mark openings is smaller than the width of the fin openings, the MOCVD growth rate in the alignment mark openings is higher than the MOCVD growth rate in the fin openings as a result of GRE. It should be noted that the growth of the semiconductor layer in the alignment mark openings can be self-limiting when the protruding portion over the hardmask is characterized by a triangular shape. In one embodiment, the plane of the sidewall of the alignment mark opening is substantially parallel to the GaN m-plane, and the protruding portion 211 over the hardmask has a height that is equal about the square root of 3 divided by 2 times the alignment mark opening width Wtr (($\sqrt{3}/2$)×Wtr). In one embodiment, a smooth surface of the regrowth facets can be obtained at a growth temperature in a range between 800° C. and 1150° C. and under a pressure of about 100 mbar with $H_2$ carrier gas. In one embodiment, the growth temperature is in a range between 850° C. and 1100° C., preferably between 900° C. and 1050° C., and more preferably between about 930° C. and 970° C., e.g., 950° C. in an embodiment. Thus, embodiments of the present invention utilize masks with two-dimensional shapes to grow three-dimensional alignment marks. The growth surfaces of the three-dimensional alignment marks (i.e., the regrowth facets shown in FIG. 2D) are bounded by crystallographic planes that produce alignment marks that can be referred to as multi-directional (e.g., six directional). As an example, the growth surfaces can be aligned parallel to the m-planes of the substrate, i.e., the <1000>, <0010> and <0100> axes.

Figure 3:
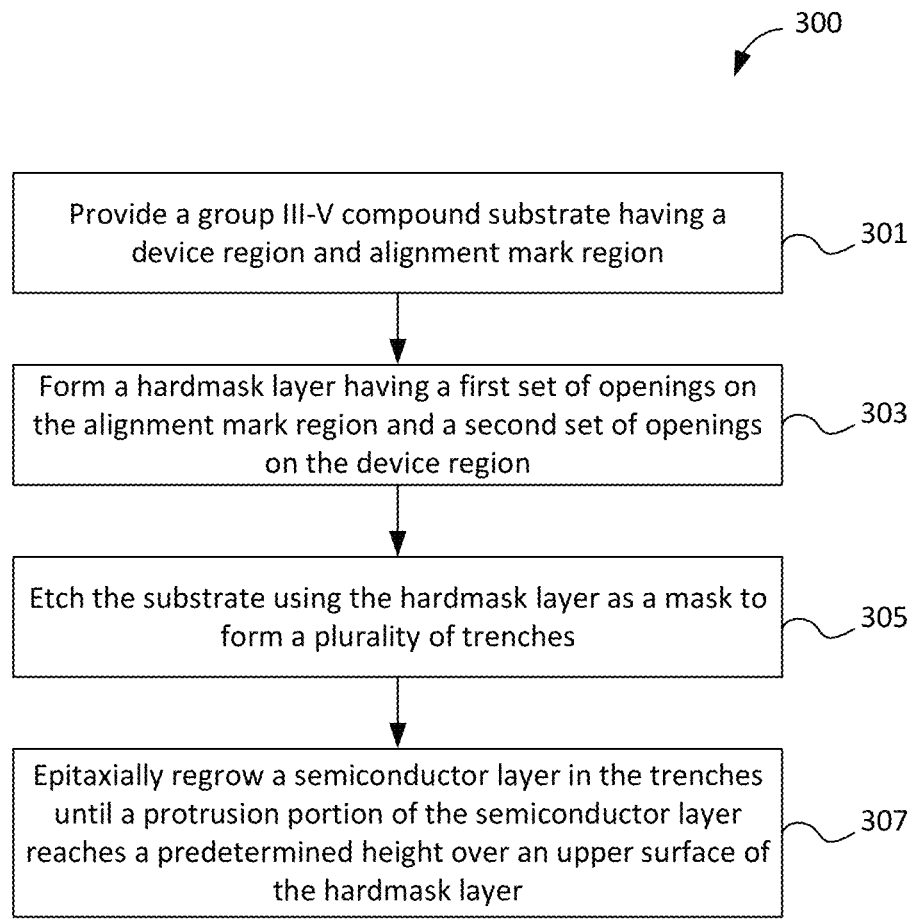
FIG. 3 is a simplified flowchart illustrating a method of forming fiducials (alignment marks) during the formation of integrated circuits on semiconductor wafers according to some embodiments of the present disclosure.

FIG. 3 is a simplified flowchart illustrating a method 300 of forming fiducials (alignment marks) during the formation of integrated circuits on semiconductor wafers according to some embodiments of the present disclosure. Method 300 may include providing a group III-V compound substrate having a device region (also referred to as an active region) and an alignment mark region (301). In one embodiment, the substrate may include a GaN material. Method 300 may further include forming a patterned hardmask layer on the group III-V compound substrate. The patterned hardmask layer includes a first set of openings on the alignment region and a second set of openings on the device region (block 303). In one embodiment, a hardmask layer includes silicon nitride and may be formed on the substrate by a PECVD or a LPCVD process. The hardmask layer is then patterned by lithography that includes forming a patterned photoresist on the hardmask layer and then etching the hardmask layer to form a patterned hardmask layer. In one embodiment, the patterned hardmask layer has a first set of openings on the alignment mark region exposing a first surface portion of the substrate and a second set of openings on the device region exposing a second surface portion of the substrate, as shown in FIG. 2A. In one embodiment, each of the first set of openings has a width of about 0.7 μm and a length of about 35 μm. The pitch of two adjacent openings of the first set of openings is about 3 μm. The first set of openings is also referred to as a 0.7/3 array herein, i.e., the opening width of the 0.7/3 array is about 0.7 μm, and the pitch of the 0.7/3 array is about 3 μm. In one embodiment, each of the second set of openings has a width of about 1.8 μm and a length that can be the same or different from the length of the first set of openings. The pitch of two adjacent openings of the second openings is about 2.0 μm. The second set of openings is also referred to as a 1.8/2.0 array, i.e., the width and the pitch of the 1.8/2.0 array are 1.8 μm and 2.0 μm, respectively. Other embodiments can utilize other values for the width and center-to-center spacing of the openings and these values are merely exemplary. One of ordinary skill in the art would recognize many variations, modifications, and alternatives.

Method 300 further includes etching the exposed first surface portion and the second surface portion of the substrate to form a plurality of trenches (305). In one embodiment, the trenches each has a depth of about 0.8 μm. Method 300 also includes epitaxially regrowing a semiconductor layer in the trenches (307) until a portion of the semiconductor layer in the second portion of the substrate becomes substantially planar to the lower surface of the hardmask layer, as shown in FIG. 2D. Simultaneously, a protrusion portion of the semiconductor layer in the first portion of the substrate reaches a predetermined height above the upper surface of the hardmask layer. The predetermined height may be determined by the width of the trenches. In one embodiment, the protrusion portion may be self-limited and have a shape of an isosceles triangle or a trapezoid with a base that is substantially flush with the substrate. For example, the protrusion portion can have a height that is equal the product of the width of the base time (sqrt(3)/2), as shown in FIG. 2D. As explained in FIG. 1, because the width (e.g., 0.7 μm) of the first set of openings is smaller than the width (e.g., 1.8 μm) of the second set of openings, and the hardmask width (e.g., 3−0.7=2.3 μm) of the first set of openings is larger than the hardmask width (e.g., 2.0−1.8=0.2 μm) of the second set of openings, the regrowth rate of the portion of the semiconductor layer in the first set of trenches is greater than the regrowth of the portion of the semiconductor layer in the second set of trenches, as shown in FIG. 2D. Method 300 may further include removing the hardmask after the epitaxially regrowing process.

In some embodiments, the epitaxial regrowth of the semiconductor layer in the device region may include regrowing a GaN layer and implanting p-type ions (e.g., magnesium). In one embodiment, implanting p-type ions may be performed concurrently with the regrowth process. In another embodiment, implanting p-type ions may be performed after the regrowth process. In some embodiments, the p-type GaN is doped with Mg with a dopant concentration of about $1 \times 10^{19}$ atoms/cm$^3$.

Figure 4:
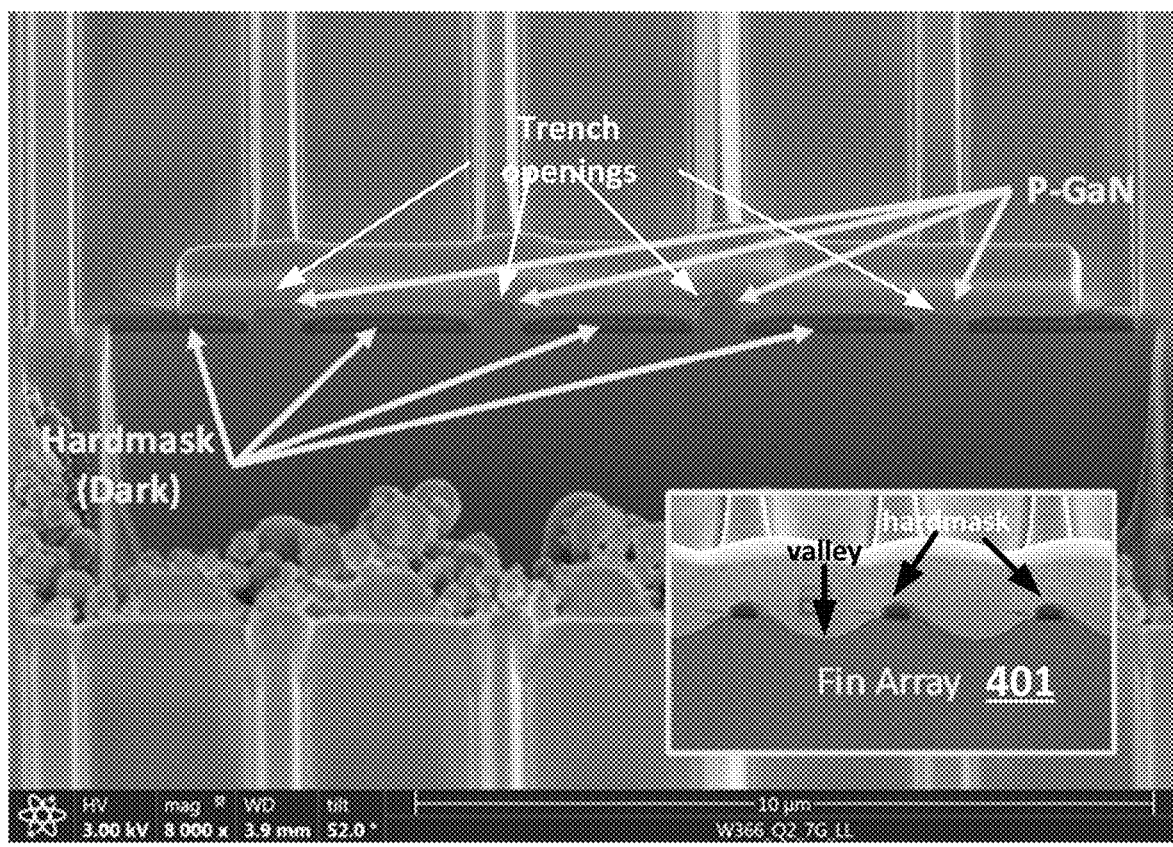
FIG. 4 is an FIB cross-section showing the different growths on the 0.7/3 array for a 400 nm-regrowth wafer according to an embodiment of the present disclosure.

FIG. 4 is a focused ion beam (FIB) cross-section showing the different growths on the 0.7/3 array (alignment mask array) and the 1.8/2.0 fin array (insert 401) for a 400 nm-regrowth wafer according to an embodiment of the present disclosure. Referring to FIG. 4, all trench openings in the 0.7/3 array show growth above the level of the hardmask, while the fin array shows non-planar growth with the growth surface (valleys) below the hardmask for a 400 nm-regrowth wafer (see insert 401). As shown in the insert 401, the regrowth semiconductor layer shows a valley in the large trench (large trench width and small hardmask width) between two adjacent fins in the active device region whereas the overgrowth in the alignment mask region (small trench width and large hardmask width) is almost complete. It is expected that the self-limiting alignment marks in the alignment mark region reach the predetermined height before the regrowth of the semiconductor layer has a planarized surface (the valley between two adjacent fins is completely filled).

Figure 5A:
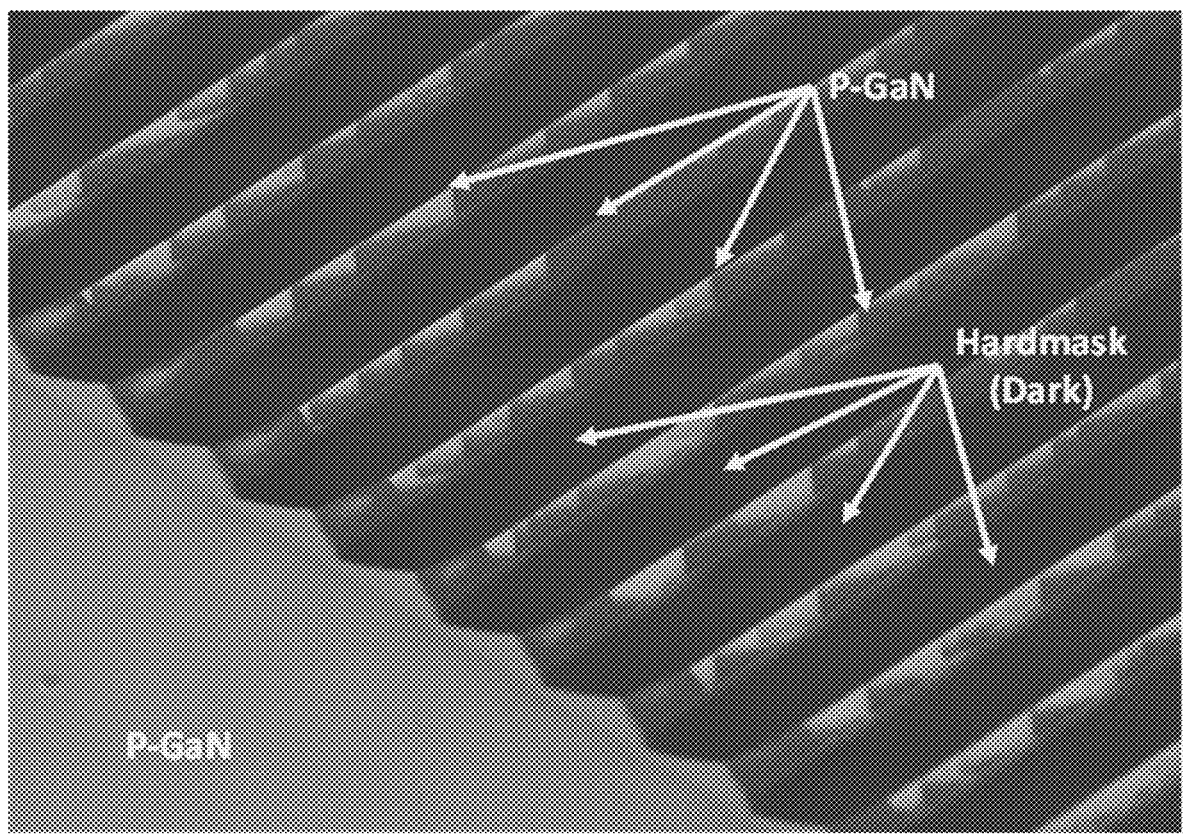
FIG. 5A is an oblique view SEM image of a 0.7/3 array on a 600 nm-regrowth wafer according to an embodiment of the present disclosure.

FIG. 5A is an oblique view SEM image of a 0.7/3 array on a 600 nm-regrowth wafer according to an embodiment of the present disclosure. Referring to FIG. 5A, the p-GaN regions (light stripes) are regrown above the hardmask (dark areas). The different contrast between different p-GaN regions is caused by the different top surfaces. The hardmask (dark area) corresponds to the hardmask layer disposed on the surface of the substrate, and the light stripes between the hardmask correspond to the protrusion portion 211 extending over the surface of the hardmask, as shown in FIG. 2D. the regrowth extends above the hardmask and forms triangles.

Figure 5B:
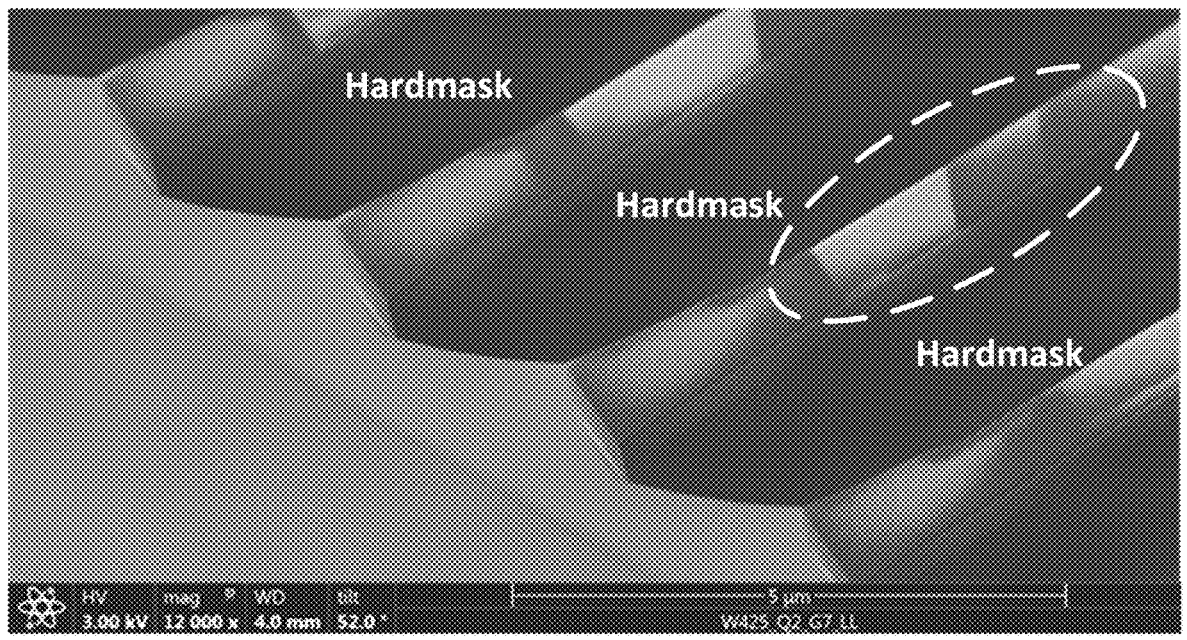
FIG. 5B is an enlarged portion of the ends of the regrown regions in FIG. 6B.

FIG. 5B is an enlarged portion of the ends of the regrown regions shown in FIG. 5A. Referring to FIG. 5B, the triangular shape of the regrowth (indicated by a dotted ellipse) extends above the hardmask (flat surface). As discussed above in connection with FIG. 2D, the epitaxially grown GaN layer in the trenches has a protrusion portion extending over the surface of the hardmask. The protrusion portion has a triangular shape that allows for precise control of the height of the protrusion portion. Referring back to FIG. 2D, when the regrowth facets meet at the vertex of the triangle, the regrowth process will stop. In other words, the regrowth of the GaN layer is self-limiting and substantially stops when the height or thickness of the protrusion portion extending over the surface of the hardmask reaches a predetermined value, which is determined by the width of the trench opening. In one embodiment, the protruding portion over the hardmask has a height that is equal about the square root of 3 divided by 2 times the alignment mark opening width. In one embodiment, a smooth surface of the regrowth facets can be obtained at a growth temperature in a range between 850° C. and 1100° C., preferably between 900° C. and 1050° C., and more preferably between about 930° C. and 970° C., and under a pressure of in a range of about 100 mbar to about 800 mbar with H$_2$ carrier gas. Therefore, according to some embodiments of the present disclosure, alignment features (marks, fiducials) can be formed by forming protruding members on a III-nitride substrate. The three-dimensional (3D) nature of the protrusion of the alignment features improve the viewability relative to the planar device region and allow alignment in the x and y directions.

Figure 6:
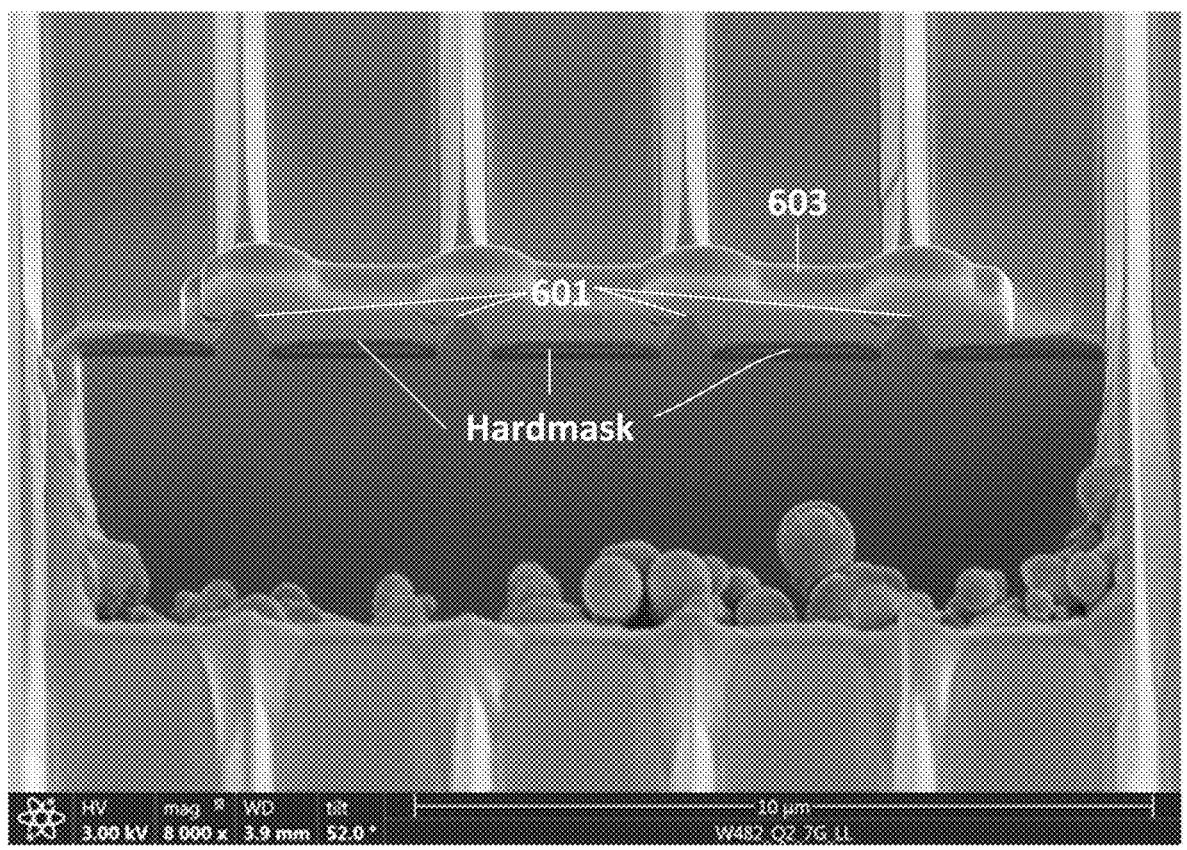
FIG. 6 is an FIB cross-section of a 0.7/3 array on a 800 nm-regrowth wafer according to an embodiment of the present disclosure.

FIG. 6 is an FIB cross-section of a 0.7/3 array on a 800 nm-regrowth wafer according to an embodiment of the present disclosure. Referring to FIG. 6, the regrowth of the alignment marks in the trench has a triangular-shaped portion 701 that extends above the hardmask. The alignment marks are self-limiting as will be described below with reference to FIGS. 7A through 7F, which show that the regrowth layer between adjacent fins has a planarized (flat) surface at the 650 nm regrowth. It should be noted that layer 603 is a protective layer that is needed only to protect the structure for the FIB process. The layer 603 is not present in the normal process, it is needed as a result of the preparative measure for the FIB procedure.

Figure 7A:
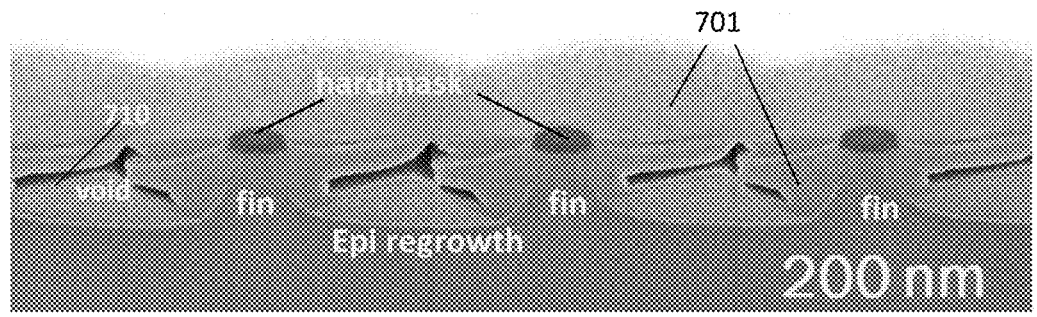
FIGS. 7A to 7F show results of regrowth profiles on respective 200 nm, 400 nm, 500 nm, 550 nm, 600 nm, and 650 nm regrowth wafers according to an embodiment of the present disclosure.

FIG. 7A is an SEM image showing a vertical regrowth profile of a semiconductor layer in a recess between adjacent semiconductor fins on a 200 nm regrowth substrate in a 1.8/2.0 fin array. Voids 710 are present under the lateral portion at the 200 nm regrowth process. These voids 710 are in a protective layer that is needed only to protect the structure for the FIB process. The voids 710 and the protective layer are not present in the normal process, and occur only as a result of the preparative measure for the FIB procedure.

Figure 7B:
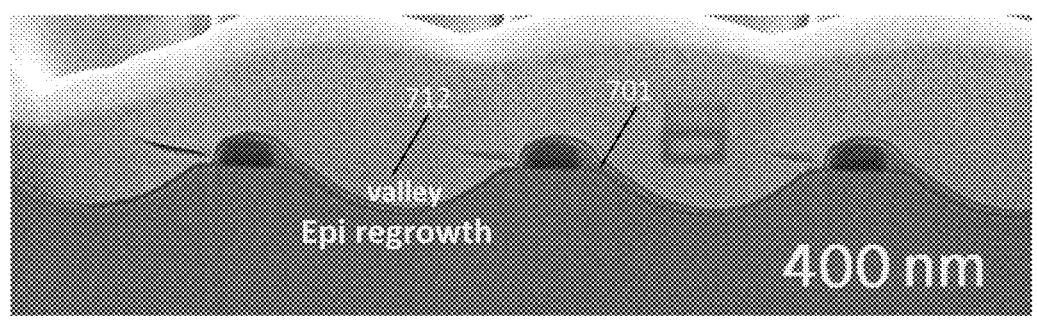

FIG. 7B is an SEM image showing a vertical regrowth profile of a semiconductor layer in a trench between adjacent semiconductor fins on a 400 nm regrowth substrate in a 1.8/2.0 fin array. For this 400 nm regrowth, a valley 712 between adjacent semiconductor fins is present. It is noted that a layer 701 is present over the hardmask. Layer 701 is a protective layer that is needed only to protect the structure for the FIB process. Layer 701 is not present in the regrowth process, it is only needed as a result of the preparative measure for the FIB procedure.

Figure 7C:
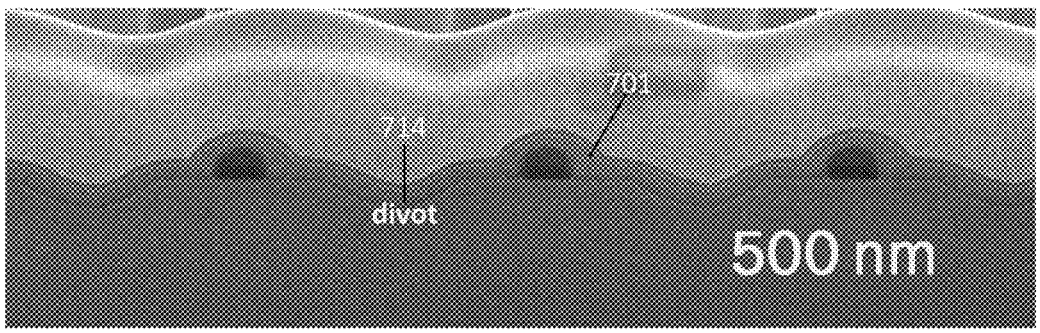

FIG. 7C is an SEM image showing a vertical regrowth profile of a semiconductor layer in a trench between adjacent semiconductor fins on a 500 nm regrowth substrate in a 1.8/2.0 fin array. Divots 714 between adjacent semiconductor fins are present.

Figure 7D:
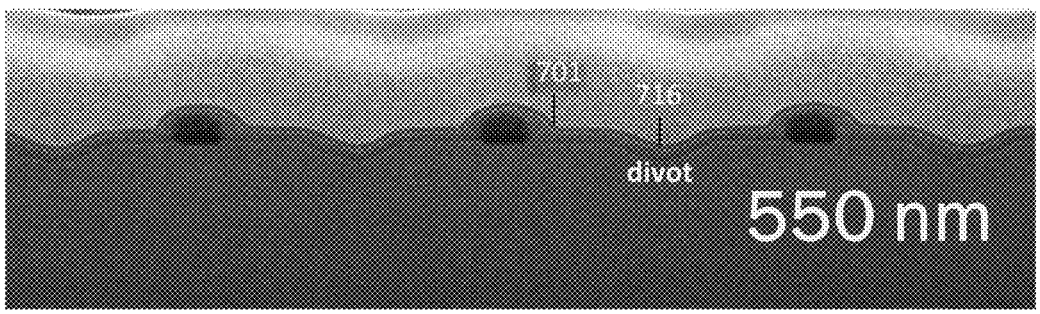

FIG. 7D is an SEM image showing a vertical regrowth profile of a semiconductor layer in a trench between adjacent semiconductor fins on a 550 nm regrowth substrate in a 1.8/2.0 fin array. Divots 718 between adjacent semiconductor fins still can be seen. Comparing with divots 714 in FIG. 8C, divots 716 are less deep. It can also be seen that the depth of divots 714, 716 shown in FIGS. 7C and 7D is smaller in the lateral and vertical directions than the valleys 712 shown in FIG. 7B. The regrowth layer between the fins on the 550 nm regrowth substrate almost achieve a planar surface. Layer 701 is a protective layer for the FIB processing. The artifact layer 701 is not required according to embodiments of the present disclosure.

Figure 7E:
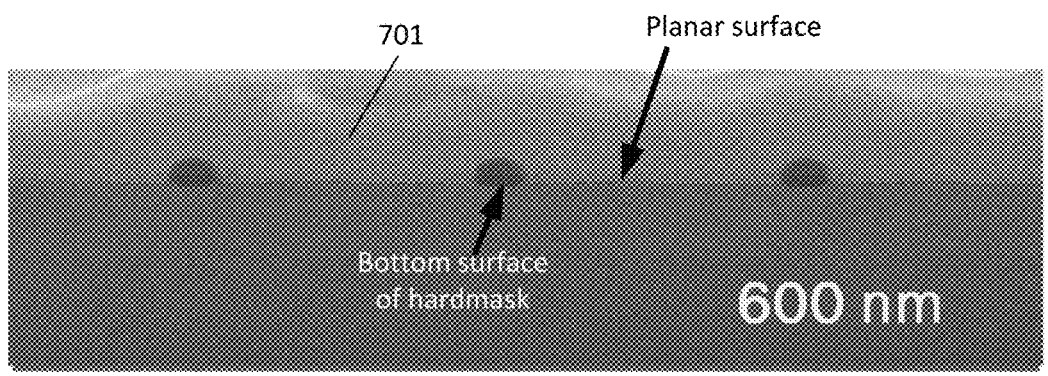

FIG. 7E is an SEM image showing a vertical regrowth profile of a semiconductor layer in a recess between adjacent semiconductor fins on a 600 nm regrowth substrate in a 1.8/2.0 fin array. The upper surface of the regrown semiconductor layer is substantially planar and flush with the bottom surface of the hardmask.

Figure 7F:
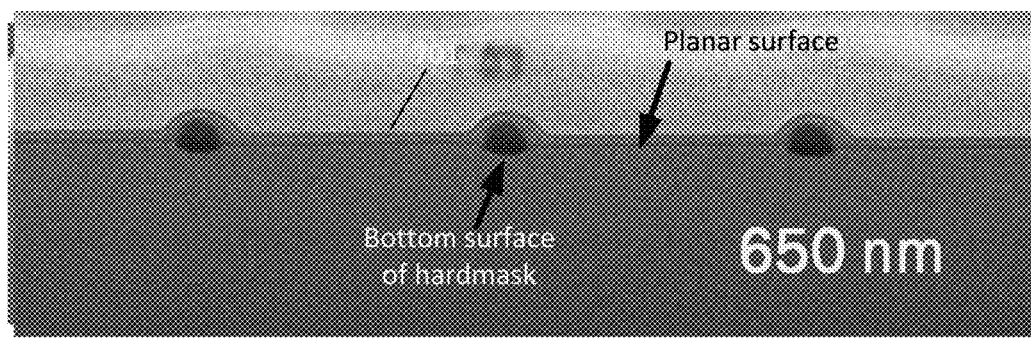

FIG. 7F is an SEM image showing a vertical regrowth profile of a semiconductor layer in a trench between adjacent semiconductor fins on a 650 nm regrowth substrate in a 1.8/2.0 fin array. The upper surface of the regrown semiconductor layer is substantially planar and above the bottom surface of the hardmask. Therefore, the inventors believe that a regrowth thickness between 550 nm and 650 nm, for the initial etched trench depth in this example, can provide acceptable planar surface for the semiconductor layer. Of course, one of ordinary skill in the art would recognize many variations, modifications, and alternatives. In one embodiment, the regrowth thickness in the active device region depends on the etch depth and the width ratio between the hardmask and the trench. In another embodiment, the flatness of the regrowth of the semiconductor layer in the active device region depends on the trench depth and the ratio between the fin width and the trench width. In one embodiment, the active device region has a trench depth of about 0.8 µm, the trench width of about 1.8 µm, and the hardmask width of about 0.2 µm (i.e., the fin width is about 0.2 µm), so that the width ratio between the trench and the hardmask in the active device region is 0.9 (1.8/0.2) to obtain a planar surface of the regrowth semiconductor layer at a regrowth thickness between 550 nm and 650 nm.

According to embodiments of the present disclosure, the hardmask material may include silicon dioxide, silicon nitride, aluminum nitride, aluminum oxide, titanium nitride, hafnium oxide, combinations thereof, or the like. The thickness of the hardmask material can vary from a few nanometers to about four hundred nm. Conventional photolithographic semiconductor processes, e.g., spin coating a photoresist on the hardmask material, selectively exposing the photoresist to light, developing the photoresist, and etching the hardmask material using the photoresist as a mask. In one embodiment, the hardmask material can be deposited by PECVD. In one embodiment, the hardmask material can be deposited by LPCVD.

Figure 8:
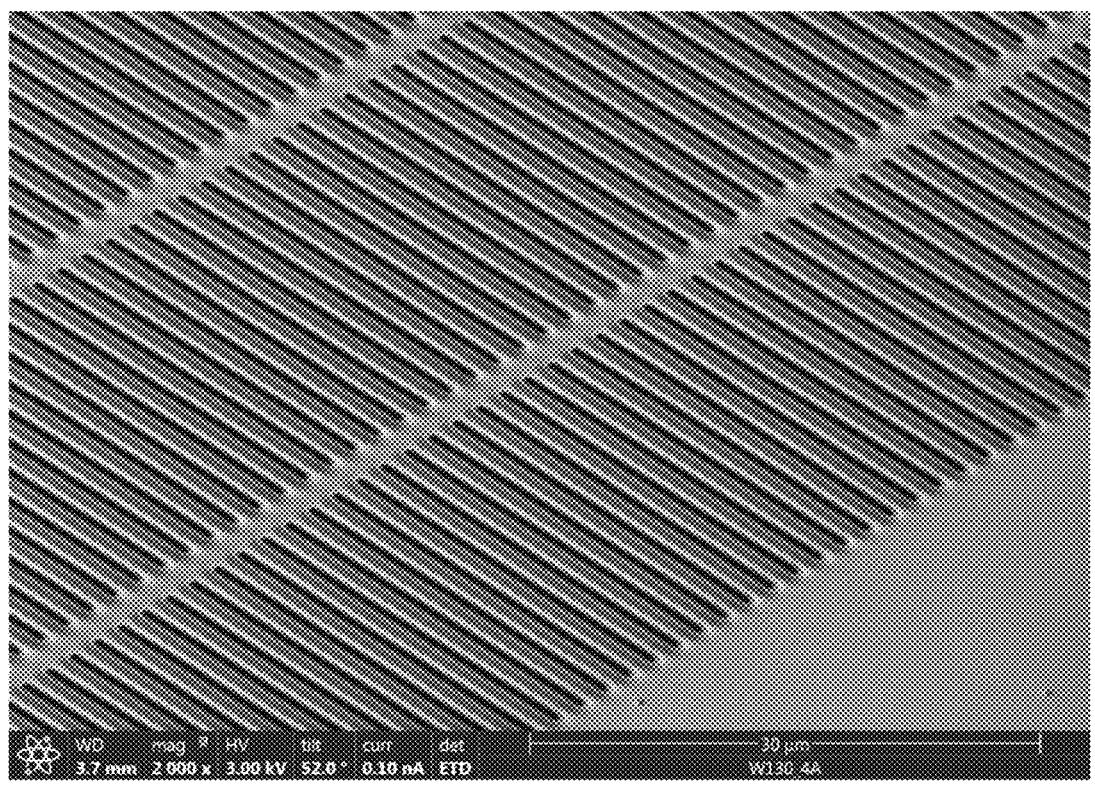
FIG. 8 is an oblique view SEM image of a 0.3 μm×25 μm long fin array with 2 μm pitch on a 500 nm-regrowth wafer according to an embodiment of the present disclosure.

FIG. 8 is an oblique view SEM image showing a 0.3 µm wide×25 µm long fin array having a 2 µm pitch (0.3/2 array) on a 500 nm-regrowth wafer according to an embodiment of the present disclosure. Referring to FIG. 8, the epitaxial regrowth of the semiconductor layer (e.g., a gate layer) between the fins has a substantially planar surface and no non-uniformity. In other words, an array of fins surrounded by a gate layer having a substantially planar surface can be formed in the recesses.

Figure 9:
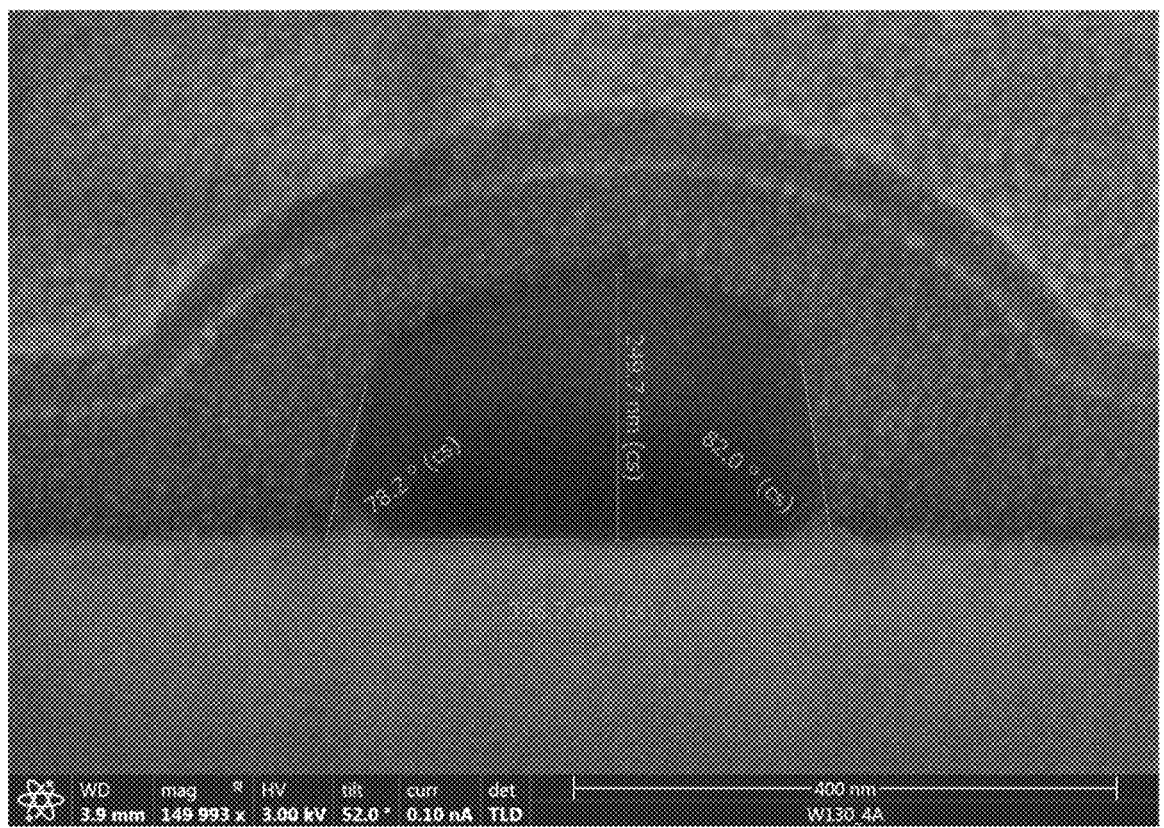
FIG. 9 shows PECVD nitride hardmask sidewall angles of a 0.3 μm hardmask width for a 0.3 μm×25 μm long fin array with 2 μm pitch according to an embodiment of the present disclosure.

FIG. 9 is an SEM image showing PECVD nitride hardmask sidewall angles of a 0.3 µm hardmask width for a 0.3 µm×25 µm long fin array with 2 µm pitch (0.3/2 array) according to an embodiment of the present disclosure. Referring to FIG. 9, the nitride hardmask layer has a thickness of about 249.7 µm and an angle in a range between 78 degrees and about 82 degrees with the hardmask width of 0.3 µm. In one embodiment, the average hardmask angle is about 80 degrees. In contrast, the angle of the vertical sidewall of the nitride hardmask by LPCVD (not shown) is about 83 degrees and higher. In other words, the sidewall erosion of the PECVD nitride hardmask is higher than that of the LPCVD nitride hardmask so that the sidewalls of the PECVD nitride hardmask are less perpendicular to the lateral surface of the substrate than the sidewall of the LPCVD nitride hardmask. The inventors concluded that the LPCVD process is superior to the PECVD process.

Figure 10:
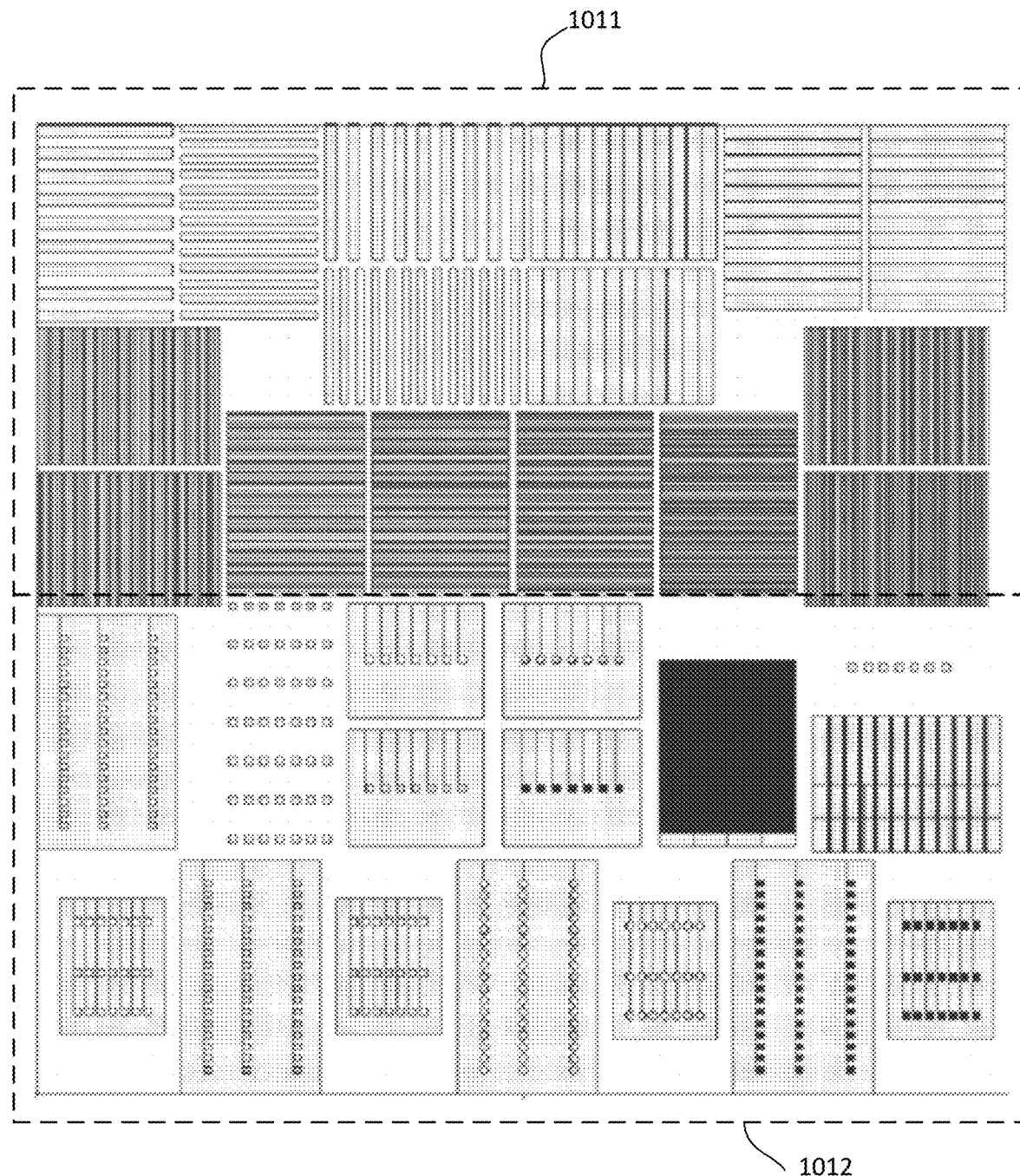
FIG. 10 shows a top view of alignment mark groups designed to form fiducials above a hardmask when fin arrays are planar according to an embodiment of the present disclosure.

FIG. 10 shows a top plan view of multiple alignment mark groups having different geometries designed to create topographical regrown features protruding above a hardmask when device fin arrays are substantially planar to the bottom of the hardmask according to an embodiment of the present disclosure. Referring to FIG. 10, a plurality of alignment mark groups can be formed at the source metal mask patterning step (e.g., the first step in the process flow of forming a vertical FinFET device). The different alignment mark groups can include multiple alignment marks for forming stripe-shaped trenches in the alignment mark region along a direction of a plurality of fins in the device region, in a direction different than a direction of the fins in the device region, and multiple alignment marks for forming polygonal shapes in the alignment mark region. For example, the upper portion 1011 includes alignment mark groups having stripes having different opening sizes and arranged in parallel to each other and spaced apart from each other by different hardmask widths. The lower portion 1-12 includes alignment mark groups having polygonal shapes (e.g., square, rectangular, honey-comb, hexagonal, etc.) and different sizes.

Figure 11A:
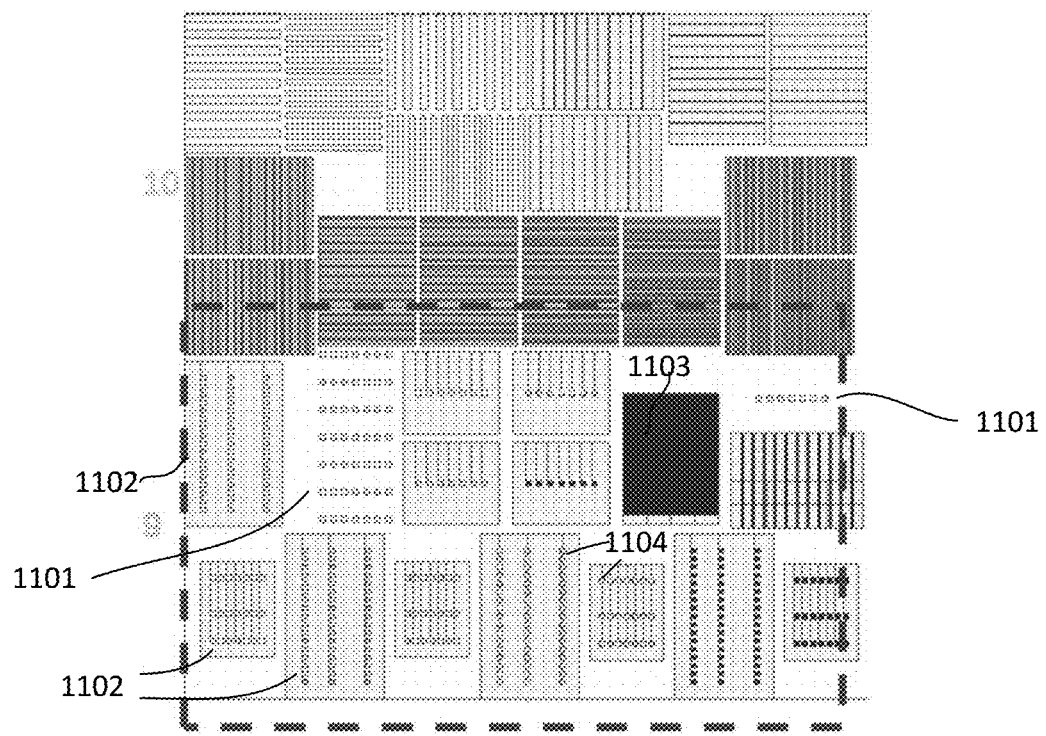
FIG. 11A shows a top view of alignment mark groups that may be used as alignment mark patterns according to some embodiments of the present disclosure.
Figure 11B:
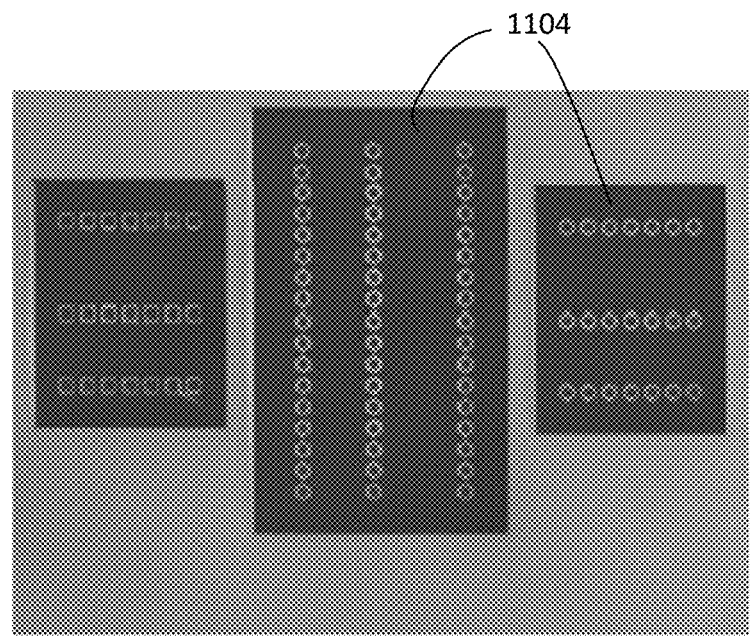
FIG. 11B shows a portion of the alignment mask results on a 500 nm regrowth wafer according to an embodiment of the present disclosure.

FIG. 11, which includes FIGS. 11A and 11B, shows a top view of alignment mark groups having different geometries that may be used as alignment mark patterns of a hardmask according to some embodiments of the present disclosure. Referring to FIG. 11A, an upper portion of the alignment mark groups includes a plurality of stripes having different geometries that are arranged in the vertical direction and in the horizontal direction. The stripes have different widths and are spaced apart from each other by different distances. The lower portion of alignment mark groups includes discrete small geometries that can be square or hexagonal in a transparent portion 1101, in a semitransparent (translucent) portion 1102, or in an opaque portion 1103. FIG. 11B shows alignment mask results on a 500 nm regrowth wafer according to an embodiment of the present disclosure. The present inventors also have found that hexagonal shaped and hexagonal annulus patterned alignment mark groups 1104 in FIG. 11A were immune to stress and showed significant growth above the hardmask.

Figure 12B:
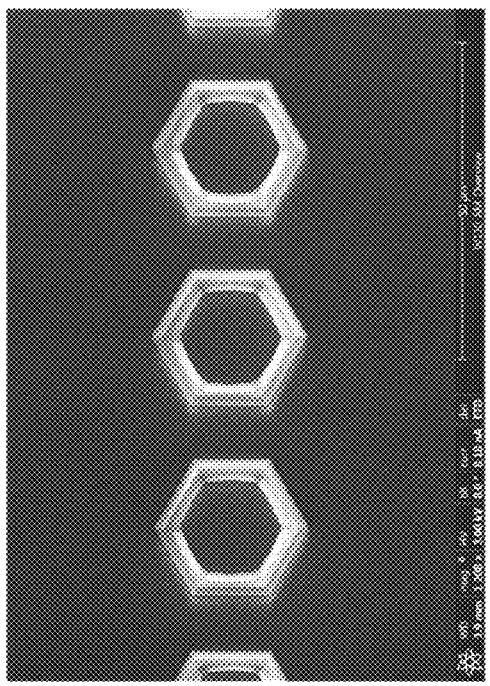
FIG. 12B shows an enlarged portion of the hexagonal annulus pattern of FIG. 14A.
Figure 12C:
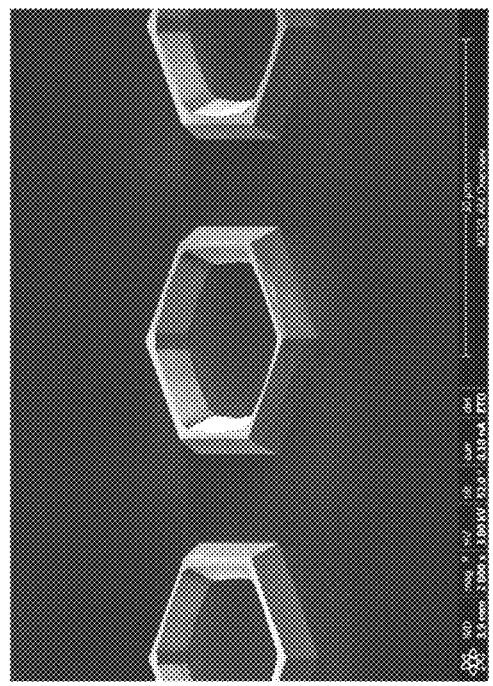
FIG. 12C is an oblique view SEM image of an enlarged portion of the hexagonal annulus pattern of FIG. 14A according to an embodiment of the present disclosure.
Figure 12A:
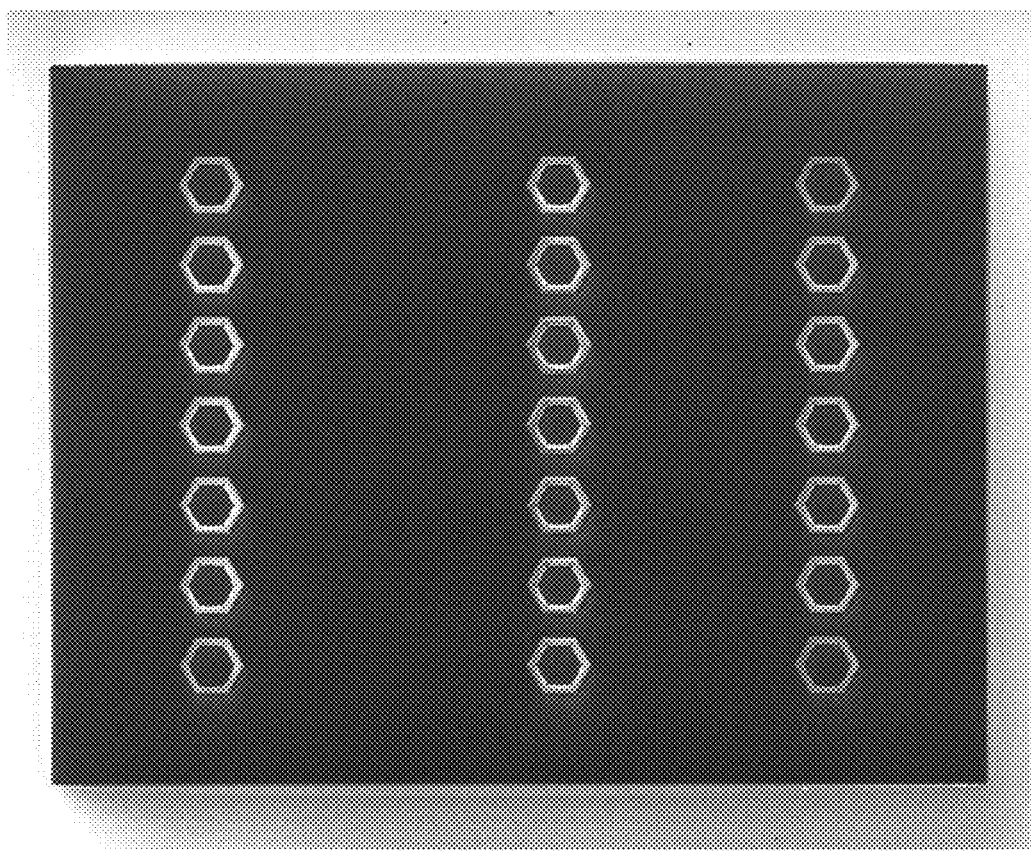
FIG. 12A shows a top view of a hexagonal annulus pattern having a regrowth above the hardmask according to an embodiment of the present disclosure.

FIG. 12A shows a top plan view of a hexagonal annulus pattern that may be formed on a semiconductor substrate according to an embodiment of the present disclosure. In one embodiment, the hexagonal annulus pattern includes an array of substantially hexagonal alignment marks. The alignment marks illustrated in FIG. 12A can be formed by overlying a patterned photoresist on a hardmask layer, the patterned photoresist may include a plurality of openings having a plurality of first openings corresponding to the array of hexagonal alignment marks in an alignment mark region and a plurality of second openings corresponding to an array of semiconductor fins disposed in a device region. A lithography process is then performed to generate the array of hexagonal shaped openings (hexagonal annulus openings) in the hardmask in the alignment mark region and a fin array in the device region, as shown in FIGS. 2A and 2B. The hardmask is used as a mask to etch the underlying semiconductor substrate to form trenches in the alignment mark region and in the device region. In one embodiment, each side of an hexagonal annulus opening has a width of about 0.7 µm and a length of about 11.5 µm. In one embodiment, each opening in the device region has a width of 1.8 µm and a length of 25 µm. An epitaxial regrowth process of a semiconductor layer is then performed in the trenches to form a protrusion portion of the semiconductor layer extending to a predetermined height over an upper surface of the semiconductor substrate. In an embodiment, the hexagonal edges are aligned parallel to the intersection of the c-plane and the m-planes of the substrate (i.e., along [0100], and [0010] directions). The epitaxial regrowth process is self-limiting as described in FIG. 2D. In one embodiment, the epitaxial regrowth process may be a p-GaN regrowth. In one embodiment, the p-GaN regrowth may be an MOVPE process.

FIG. 12B shows an enlarged portion of the hexagonal annulus pattern in FIG. 12A. FIG. 12C is an oblique view SEM image of an enlarged portion of the hexagonal annulus pattern in FIG. 12A according to an embodiment of the present disclosure. It is noted that the hexagonal annulus patterned alignment marks have a significant growth above the hardmask (dark background) and good triangular-shaped sides. As illustrated, in FIG. 12C, the growth of the alignment marks proceeds along six directions aligned with the m-planes of the hexagonal crystal structure that bound the growth. Thus, the outer surfaces of the hexagonal annulus pattern (i.e., the growth surfaces) define six directions, enabling the hexagonal annulus pattern to be referred to as a multi-directional alignment mark, for example, at least three-directional growth surfaces. For example, the outer surfaces of the hexagonal annulus comprise (10-11), (01-11), (-1101), (-1011), (0-111) and (1-101) planes. It should be noted that the interior surfaces of the hexagonal annulus pattern are aligned with corresponding outer surfaces.

Figure 13A:
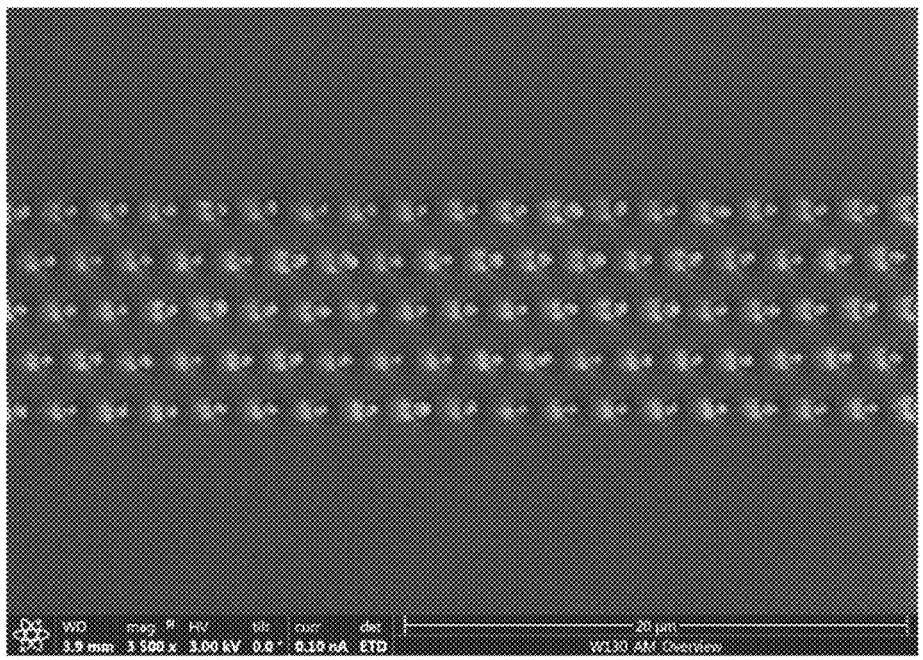
FIG. 13A is an array of hexagonal-pyramid shaped protrusions showing a regrowth above the hardmask according to an embodiment of the present disclosure.
Figure 13B:
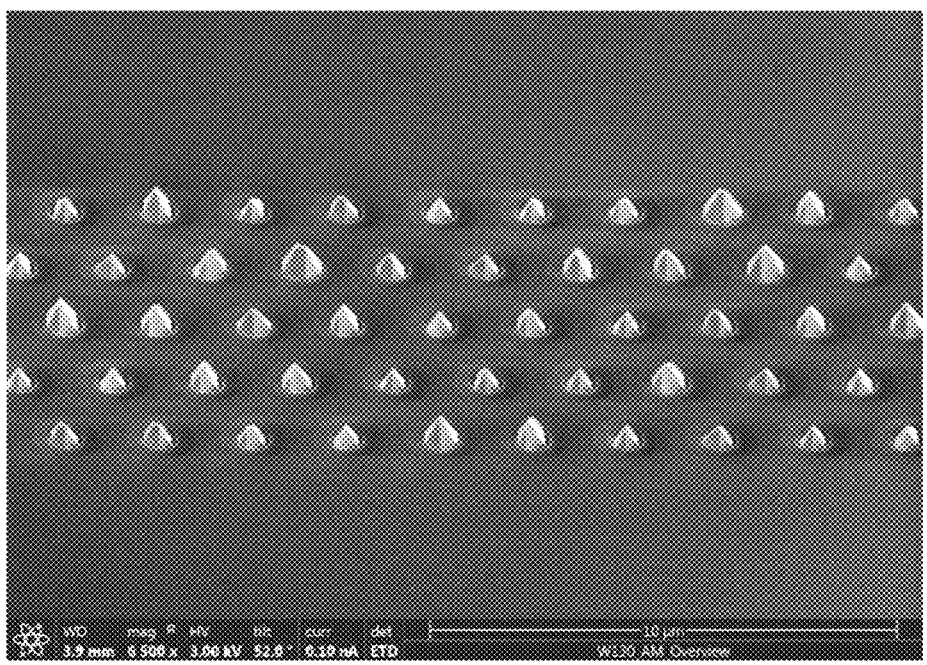
FIG. 13B shows an enlarged portion of the array in FIG. 13A.

FIG. 13A shows an array of hexagonal pyramids that can be used as fiducials (alignment marks) according to an embodiment of the present disclosure. FIG. 13B shows an enlarged portion of the array of hexagonal pyramids in FIG. 13A. Issues in the lithography process may contribute to the irregular sizes of the pyramids. The regrowth of the hexagonal pyramids is self-limiting and substantially stops when the six side faces of a hexagonal pyramid intersect one another. Thus, embodiments of the present invention provide three-dimensional and six-directional alignment marks that are defined by a three-dimensional shape formed by the six side faces of the hexagonal pyramid, which each have a different growth direction. In an embodiment, the six side faces of the hexagonal pyramid are the (10-11), (01-11), (-1101), (-1011), (0-111) and (1-101) planes.

The above described embodiments have a vertical regrowth semiconductor layer both in the alignment mark region and in the device (active) region. The alignment mark region includes an array of alignment marks that may include patterns shown in FIG. 10. The device or active region may include a plurality of semiconductor fins arranged in parallel to each other. The alignment marks and the semiconductor fins can be arranged in the same direction or in different directions. In some embodiments, the alignment marks can be placed in a periphery of a wafer (substrate), in a periphery of device boundaries, or in a scribe line of a wafer (substrate). The regrown portion of the semiconductor layer in the alignment mark region protrudes over the upper surface of the hardmask layer. In one embodiment, the regrown portion of the semiconductor layer in the device region has an upper surface that is substantially flush with a bottom surface of the hardmask layer, i.e., substantially flush with an upper surface of the substrate when the hardmask layer is removed. In one embodiment, the surface of the substrate is in the c-plane, and the regrowth portion of the semiconductor layer is oriented along the m-plane directions (i.e., the edge of the regrowth where it intersects the c-plane is in one of the [1000], [0100], or [0010] directions).

Many possible alignment mark patterns may be utilized, as shown in FIGS. 10 and 11A. In one embodiment, the alignment marks may include an array of hexagonal annulus patterns as shown in FIG. 12A. In one embodiment, each side of a hexagonal annulus pattern is aligned with the m-plane of the substrate. In one embodiment, the alignment marks may include an array of hexagonal pattern as shown in FIG. 13A. In one embodiment, each side of the bottom surface of a hexagonal pattern is aligned with the m-plane of the substrate. In one embodiment, the substrate is a III-V compound substrate. In one embodiment, the substrate include GaN.

In one embodiment, the protruding portion of the semiconductor layer in the alignment region is self-limiting and has a thickness of height $H=(\sqrt{3}/2)*W$, where W is a width of a trench opening defined by the hardmask layer.

In one embodiment, the protrusion portion of the semiconductor layer in the alignment region is an isosceles triangle or a trapezoid having a base angle in a range between 58 degrees and 65 degrees in a cross-sectional view.

In one embodiment, the alignment mark region has a plurality of trenches each having a depth of about 0.8 µm, a width of about 0.7 µm, and a width of the hardmask layer between two adjacent openings of about 3 µm.

In some embodiments, the ratio between the width of an opening and the width of the hardmask layer in the alignment mark region is less than one, while the ratio between the width of an opening and the width of the hardmask layer in the device region is much greater than one. In one embodiment, the ratio between the width of an opening for epitaxial growth of alignment marks and the width of the hardmask layer disposed between two adjacent openings is about 0.233. In one embodiment, the ratio between the width of an opening for epitaxial growth of planar epitaxial regions in the device region and the width of the hardmask layer disposed between two adjacent openings is between 6 and 10, e.g., about 9. In one embodiment, the openings each may include a hexagonal annulus pattern. In one embodiment, each side of the hexagonal annulus pattern is aligned with an m-plane of the III-V (e.g., III-nitride) compound substrate.

In one embodiment, the hardmask layer in the device or active region includes an array of elongated openings arranged in parallel to each other configured to form a plurality of semiconductor fins. In one embodiment, the elongated openings each have a width in a range between about 0.2 µm and about 0.3 µm, a length in a range between about 25 µm and about 1000 µm, and a pitch between two adjacent elongated openings is in a range between about 1.9 µm and about 10 µm. The scope of the present disclosure is not limited to the arrangement of the fins in the drawings in relation to the alignment marks.

In one embodiment, the substrate is a III-V compound substrate including an n-GaN epitaxial layer, and the semiconductor layer include a p-GaN regrown epitaxial layer.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

What is claimed is:

1. A method of forming alignment marks, the method comprising:

providing a III-V compound substrate having a device region and an alignment mark region, wherein the III-V compound substrate is characterized by a processing surface;

forming a hardmask layer having a first set of openings on the alignment mark region exposing a first surface portion of the processing surface of the III-V compound substrate and a second set of openings on the device region exposing a second surface portion of the processing surface of the III-V compound substrate;

etching the first surface portion and the second surface portion of the III-V compound substrate using the hardmask layer as a mask to form a plurality of trenches; and epitaxially regrowing a semiconductor layer in the trenches to form the alignment marks extending to a predetermined height over the processing surface of the III-V compound substrate.

2. The method of claim 1, wherein the III-V compound substrate comprises GaN.

3. The method of claim 1, wherein the trenches each have a depth of about 0.8 μm.

4. The method of claim 1, wherein the trenches each have a width of about 0.7 μm, and a width of the hardmask layer between two adjacent openings is about 3 μm.

5. The method of claim 1, wherein a ratio of a width of an opening and a width of the hardmask layer between two adjacent openings is about 0.233.

6. The method of claim 1, wherein the first set of openings comprises an array of hexagonal annulus patterns.

7. The method of claim 6, wherein each side of a hexagonal annulus pattern is aligned with an m-plane of the III-V compound substrate.

8. The method of claim 1, wherein the predetermined height is determined using an equation:

$$H=(\sqrt{3}/2)*W,$$

wherein H is the predetermined height, and W is a width of a trench opening.

9. The method of claim 1, wherein the alignment marks are characterized by an isosceles triangular shape having a base angle in a range between 58 degrees and 65 degrees in a cross-sectional view.

10. The method of claim 1, wherein the second set of openings comprise an array of elongated openings arranged in parallel to each other configured to form a plurality of semiconductor fins.

11. The method of claim 10, wherein the elongated openings each have a width in a range between about 0.2 μm and about 0.3 μm, a length in a range between about 100 μm and about 1000 μm, and a pitch between two adjacent elongated openings is in a range between about 1.9 μm and about 10 μm.

12. The method of claim 1, wherein the III-V compound substrate comprises an n-GaN epitaxial layer, and the semiconductor layer comprises a p-GaN epitaxial layer.

13. The method of claim 1, wherein epitaxially regrowing the semiconductor layer is self-limiting in the alignment mark region.

14. A semiconductor device comprising:
a III-V compound substrate comprising a device region and an alignment mark region including a plurality of trenches; and
a plurality of three-dimensional alignment marks, each of the plurality of three-dimensional alignment marks being disposed in one of the plurality of trenches in the alignment mark region, each of the plurality of three-dimensional alignment marks comprising a protrusion portion extending over a surface of the III-V compound substrate.

15. The semiconductor device of claim 14, wherein each of the three-dimensional alignment marks comprises a hexagonal shaped, annular, alignment mark in plan view having a predetermined height and characterized by at least three directional growth surfaces.

16. The semiconductor device of claim 15, wherein the protrusion portion has an isosceles triangle or trapezoid shape with a base angle in a range between 58 degrees and 65 degrees in a cross-sectional view.

17. The semiconductor device of claim 15, wherein the protrusion portion has a shape of an isosceles triangle or a trapezoid with a base substantially flush with a surface of the III-V compound substrate in a cross-sectional view.

18. The semiconductor device of claim 17, wherein the protrusion portion has a shape of an isosceles triangle and the predetermined height is determined using an equation:

$$H=(\sqrt{3}/2)*W,$$

wherein H is the predetermined height, and W is a width of the base of the isosceles triangle.

19. The semiconductor device of claim 14, wherein the III-V compound substrate comprises an N—GaN epitaxial layer, and the plurality of three-dimensional alignment marks comprise a p-GaN epitaxial layer.

20. The semiconductor device of claim 14, wherein the device region comprises a plurality of semiconductor fins arranged in parallel to each other, wherein a regrown layer between each of the plurality of semiconductor fins has a regrowth surface lower than the protrusion portion of each of the plurality of three-dimensional alignment marks.

* * * * *